US008365114B2

(12) United States Patent
Arbel et al.

(10) Patent No.: US 8,365,114 B2
(45) Date of Patent: Jan. 29, 2013

(54) LOGIC MODIFICATION SYNTHESIS

(75) Inventors: Eli Arbel, Nesher (IL); David Geiger, Peekskill, NY (US); Victor Kravets, New York, NY (US); Smita Krishnaswamy, New York, NY (US); Ruchir Puri, Baldwin Place, NY (US); Haoxing Ren, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 12/862,838

(22) Filed: Aug. 25, 2010

(65) Prior Publication Data

US 2012/0054698 A1    Mar. 1, 2012

(51) Int. Cl.
G06F 9/455    (2006.01)
G06F 17/50    (2006.01)
(52) U.S. Cl. .................... 716/107; 716/106
(58) Field of Classification Search ............ 716/107
See application file for complete search history.

(56) References Cited

U.S. PATENT DOCUMENTS

| 6,631,510 | B1 | 10/2003 | Betz ................... 716/16 |
| 6,653,073 | B1 | 11/2003 | Comings .............. 435/6 |
| 7,168,055 | B2 | 1/2007 | Hoff .................... 716/4 |
| 2005/0235234 | A1 | 10/2005 | Lakshmanan ........ 716/4 |
| 2009/0178015 | A1 | 7/2009 | Federovsky .......... 716/3 |
| 2009/0183134 | A1 | 7/2009 | Herzl ................... 716/11 |
| 2009/0183135 | A1 | 7/2009 | Herzl ................... 716/17 |

FOREIGN PATENT DOCUMENTS

WO    WO9827499    6/1998

OTHER PUBLICATIONS

Ling, Andrew; Brown, Stephen; Zhu, Jianwen; Safarpour, Sean; "Toward Automated ECOs in FPGAs," Feb. 22, 2009, FPGA '09, ACM.*
U.S. Appl. No. 12/497,499, filed Jul. 2, 2009, Hopkins.
A. Ling, et al. "Towards Automated ECOs in FPGAs," proc. FPGA, 2009, pp. 3-12.
S. Safarpour, et al. "Improved Design Debugging Using Maximum Satisfiability," proc. FMCAD, 2007, pp. 13-19.
A. Smith, et al. "Design Diagnosis Using Boolean Satisfiablity," proc. ASPDAC 2004, pp. 218-223.
K-H. Chang, et al. "Fixing Design Errors with Counter-examples and Resynthesis," IEEE Trans. On CAD, vol. 27, No. 1, Jan. 2008, pp. 184-188.
S. Krishnaswamy, et al., "DeltaSyn: An Efficient Logic-Difference Optimizer for ECO Synthesis," proc. ICCAD 2009.

(Continued)

*Primary Examiner* — Vuthe Siek
*Assistant Examiner* — Eric Lee
(74) *Attorney, Agent, or Firm* — George Sai-Halasz; Preston J. Young

(57) ABSTRACT

Two circuits, an original and a modified, are being recognized, with the original circuit having a first logic and the modified circuit having a second logic. The second logic contains at least one desired logic change relative to the first logic. An equivalence line is detected in the original circuit such that the first and second logic are equivalent from the circuit inputs to the equivalence line. At least one point of change is located amongst the logic gates that are neighboring the equivalence line. The points of change are accepted as verified if an observability condition is fulfilled. The observability condition is checked within a Boolean Satisfiability (SAT) formulation. Substitute logic for the verified points of change is derived using SAT and Boolean equation solving techniques, in such manner that the first logic becomes equivalent to the second logic.

6 Claims, 4 Drawing Sheets

OTHER PUBLICATIONS

T. Schuele, K. Schneider "Three-valued logic in bounded model checking," Formal Methods and Models for Co-Design, 2005, pp. 177-186.

A. Kuehlmann, "Dynamic transition relation simplification for bounded property checking," Proc. of the Intnatl. Conf. on Computer-Aided Design, 2004, pp. 50-57.

C. Sinz, "Towards an optimal CNF encoding of boolean cardinality constraints," Proc. of the Intnatl. Conf. on Princ. and Practice of Constraint Programming, 2005, pp. 827-831.

C.-C. Lee, et al. "Scalable exploration of functional dependency by interpolation and incremental SAT solving," Proc. of the Intnatl. Conf. on Computer-Aided Design, 2007, pp. 227-233.

"Engineering Change Order (ECO) Support in Programmable Logic Design"—White Paper on the Internet: http://www.altera.ru/Disks/Altera%20Documentation%20Library/literature/wp/wp_ecopld.pdf.

C.-C. Lin, et al. "Logic Synthesis for Engineering Change" IEEE Trans. Computer-Aided Design of Integrated Circuits and Systems, vol. 18, No. 3, 1999, pp. 282-292.

* cited by examiner

LOGIC MODIFICATION SYNTHESIS

BACKGROUND

The present invention relates to integrated circuit (IC) design. In particular, it relates to making logic changes in an already implemented circuit, which logic changes in some sense are small.

It is known that in existing design flows, even a small change in the specification, such as would be usual for an engineering change order (ECO), can lead to large changes in the implementation. There is a need for computer-aided design (CAD) methodologies to handle relatively minor logic changes specified for an existing circuit, without restarting the entire logic synthesis process.

BRIEF SUMMARY

A computer-executed method is disclosed. The method recognizes two circuits, an original and a modified circuit, with the original circuit having a first logic and the modified circuit having a second logic. The second logic contains at least one desired logic change relative to the first logic. The method includes detecting an equivalence line in the original circuit, such that the first and second logic are equivalent from the circuit inputs to the equivalence line, and finding at least one point of change amongst the logic gates that are neighboring the equivalence line. Next, accepting the points of change as verified point of change if an observability condition is fulfilled, which means that for every input vector for which an output of the original and modified circuits differ, at least one logic value of the points of change propagate to that output of the original circuit. This observability condition is checked within a Boolean Satisfiability (SAT) formulation. The method also includes deriving a substitute logic for the verified points of change in such manner that the first logic in the original circuit becomes equivalent to the second logic.

BRIEF DESCRIPTION OF THE SEVERAL VIEWS OF THE DRAWINGS

These and other features of embodiments of the invention will become apparent from the accompanying detailed description and drawings, wherein.

DETAILED DESCRIPTION

Figure 1:
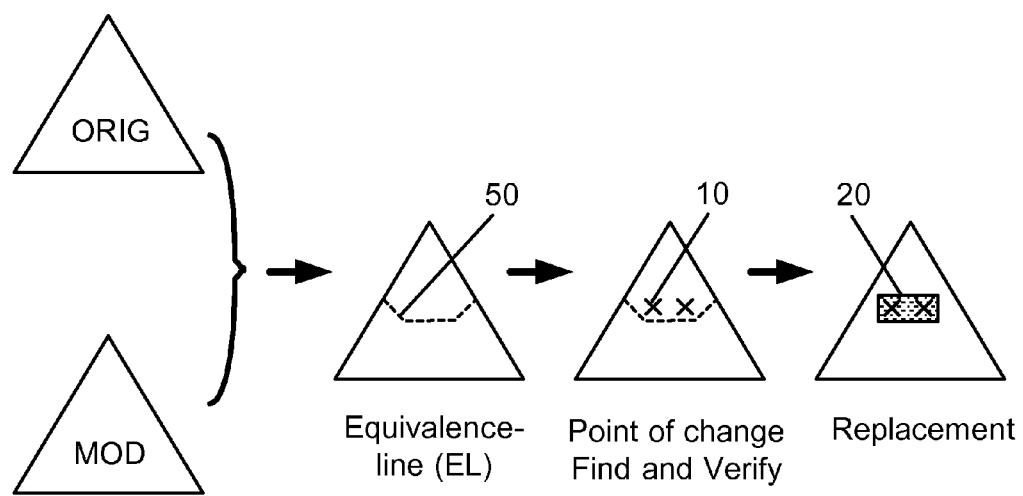
FIG. 1 shows an embodiment of the disclosed method in a symbolic representation.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "logic," or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the description of the computer executable method and/or the flowcharts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Integrated circuits (IC) at times may have to undergo modifications to their functional specification. Frequently, such modifications are expressed as an engineering change order (ECO). Often the needed modifications may be quite minor, incremental in nature. In spite of the modifications being relatively minor, possibly extending to only a small fraction of the logic functions of the IC, the logically modified IC is typically redone from the start, as it were a new design. Redesigning logic, however, may involve high costs in terms of design effort and time.

There are difficulties implementing even small functional changes incrementally into an existing IC design. IC logic design is a highly automated process, typically called computer aided design (CAD). During CAD, logic optimizations can render intermediate signals in the IC unrecognizable, usually prohibiting simple manual repair of the existing logic. Also, there is an inherent randomness in automated optimization choices. This randomness may make the design process unstable, i.e., a slight modification of the specification can lead to a completely different implementation, one that is practically unrecognizable relative to the original IC.

Embodiments of this disclosure present a computer executed method for implementing desired logic changes in an original circuit, which desired logic changes are contained in a modified circuit, without having to do a full new design. The desired logic changes are obtained by converting a modified specification into a preliminary gate-level form. Embodiments of the method execute optimally if the desired changes in the original circuit are relatively few. The modified circuit in a typical embodiment of the invention represents, or is, an ECO. Usually one compiles a modified specification, in the form of modified register transfer level (RTL) description, into a preliminary gate-level form, which is the ECO model, or modified model.

An engineering change order (ECO) deep in a design cycle maybe a common reason for having to implement logic changes into an essentially completed design. However, ECO may not be the only such reason, there maybe other causes. For instance, a subsequent generation of a design maybe quite similar to the older one, and would be desirable to avoid full redesign. Or, for instance, the function of two IC-s are physically merged onto the same chip, and to accommodate this, the IC-s need slightly modified logic. From the point of view of the embodiments of the present invention, it is immaterial what the origin for a modification is, whether it is an ECO, or a differing reason. Any and all sources of logic change are within the capabilities of the disclosed methods.

For clarifying nomenclature, and for reference to the terms used in the present specification, the circuits involved in embodiments of the present invention are as follows. First, there is the original circuit. This is the original synthesized, placed, routed, and optimized design, having the original logic, which also may be referred to as a first logic. Second, there is the modified specification (RTL), from which a modified circuit is derived through conversion to a preliminary gate-level form. This is represented by a modified logic, which also may be referred to as a second logic, expressing at least one desired change relative to the first logic of the original circuit. In the following, the terms modified circuit, modified logic, second logic, will be interchangeably used.

FIG. 1 shows an embodiment of the disclosed method in a symbolic representation, giving an illustrative summary of the major steps involved. The original design, or original IC "ORIG", and the functionally modified circuit "MOD", typically expressed in an ECO, are the inputs recognized by the computer executed method of the present disclosure. The original circuit has a first logic. The modified circuit has a second logic, which second logic has at least one desired logic change relative to the first logic. Most ECOs are indeed small changes to the specification, usually involving less than about 100 points of change, more typically less than about 20 points of change. For such cases embodiments of the present disclosure use completely functional techniques, not relying on local or structural matches to find, verify, and correct the points of change.

Given the two circuits, next, the embodiments of the method locate an equivalence line 50 (EL) in the original circuit. The equivalence line is such that the first and second logic are equivalent from the inputs of the original circuit up to the equivalence line 50. Next, one locates the points of change in the original circuit through a SAT-based change-finding formulation. There may be only a single point of change, or there may be a plurality of them. In finding the points of change 10 the assumption is made that the logic changes are located amongst the logic gates that are neighboring the equivalence line 50.

Following the finding of the points of change, which at this stage are only potential points of change, embodiments of the method go through a verification procedure to determine if indeed such a point of change 10 has been found which is suitable for implementing a desired logic change represented by the ECO.

Finally the verified points of change are functionally replaced 20 with logic which substitutes the second logic of the ECO for the original circuit, thus completing the task.

Figure 2:
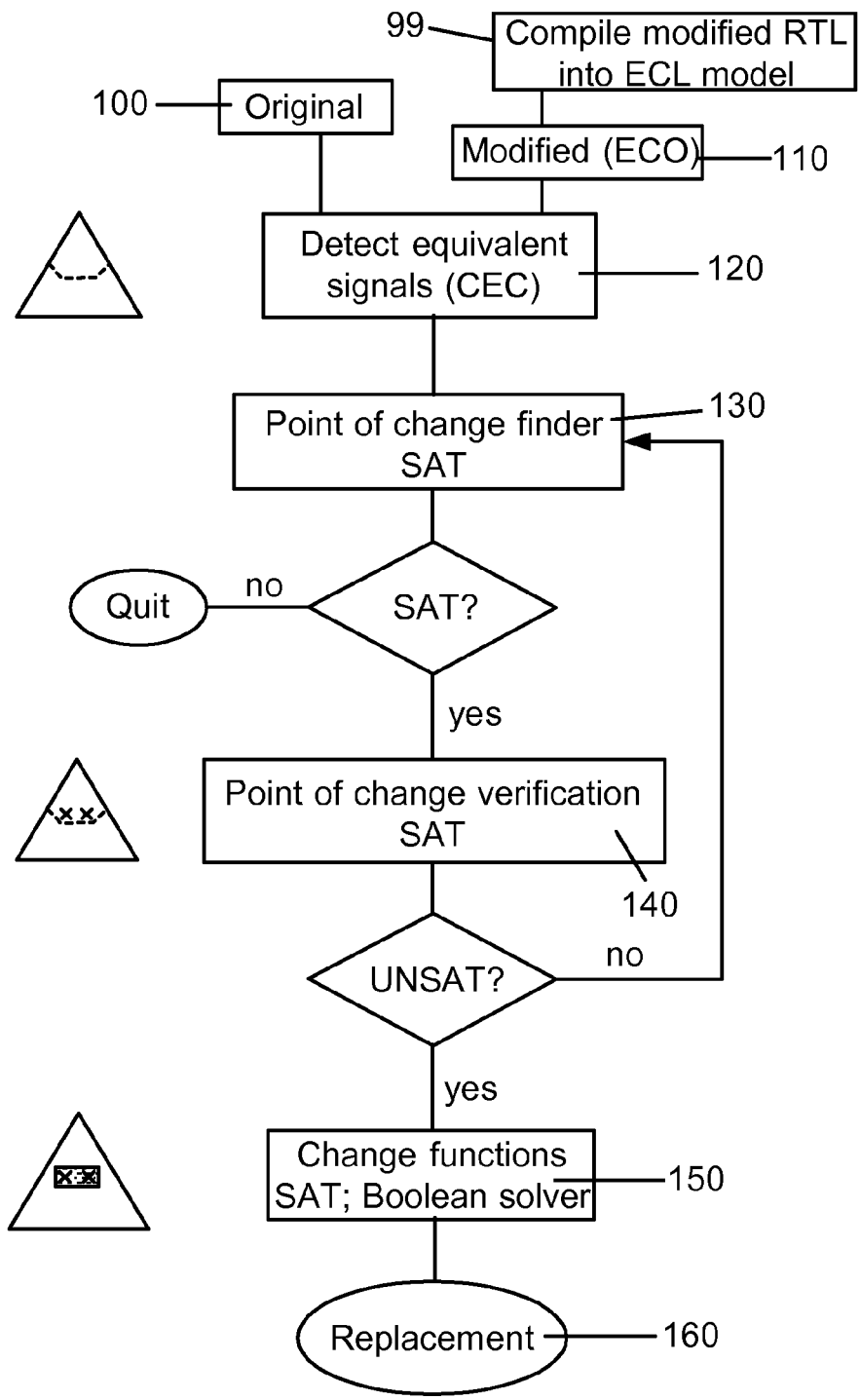
FIG. 2 shows a flowchart of embodiments of the method for implementing desired logic changes in a circuit.

FIG. 2 shows a flowchart of embodiments of the method for implementing desired logic changes in a circuit. The flow of the figure is downwards, unless arrowheads point in a different direction. One may start with preprocessing 99, where a modified RTL specification is compiled into an ECO model. Two integrated circuits are recognized, or accepted, an original 100, and a modified 110 circuit. The original 100 circuit has a first logic and the modified 110 circuit has a second logic. The second logic has at least one desired logic change relative to the first logic. The modified circuit typically expresses an ECO. As is usual with digital ICs, both circuits have logic gates, both have inputs, and both are capable to accept and propagate input vectors, or signals, and to produce outputs. A vector in a digital IC typically means digital values, zeros or ones, on a plurality pins. The pins may be input pins, in which case an input vector would be externally applied. The logic values on internal pins, may show a state of an input vector after propagating across one or more logic gates. Or, dealing with computer representations of the circuits, one may also apply a conceived logic value patterns to the internal pins of an IC. In any case, a vector may propagate through logic gates, and ultimately it may appear as a set of digital values on the output pins of the circuits.

Both the original 100 and modified 110 circuit behavior my be simulated in response to random input vectors, namely applying to the input pins a random sequence of zeros and ones. Since the original 100 and modified 110 circuit logic contain only minor differences, the output of the two circuits in response to most input vectors will be the same. However, there may be some particular ones for which the output of the two circuits differ. Such vectors are of interest since they may provide information on the logic difference between the two circuits. Those input vectors for which the output response of the original and modified circuits differ are referred to as the test vectors.

Having recognized, or received the circuits, embodiments of the disclosed method proceed 120 by locating an equivalence line in the original circuit 100. The triangular shapes to the left of the flowchart are the symbols appearing in FIG. 1, indicating a similar step as the box in the flowchart that they appear next to, thereby better illuminating the connections between various depictions/descriptions of the process. The equivalence line is such that the first and second logic are equivalent from the inputs of the original circuit up to the equivalence line. The equivalence line is in an abstract space of logic, and in no way is meant to imply, for instance, some sort of physical boundary on a semiconductor chip. In a placed circuit, the EL 50 would most likely appear as randomly scattered circuit elements.

Locating the equivalence line is accomplished by Combinatorial Equivalence Checking (CEC). CEC is a known method for such purposes. Briefly, during its application, all, or at least a meaningfully large fraction of all, internal logic patterns are looked and compared for both the first and second logic, in response to random inputs. Identical patterns are discarded, while differing patterns may be indicative of logic differences. Such a CEC method was also applied and described, for instance, in U.S. patent application Ser. No. 12/497,499, filed: Jul. 2, 2009, now U.S. Pat. No. 8,122,400, titled: "Logic Difference Synthesis", by J. Hopkins et al. incorporated herein by reference.

Following the locating of an equivalence line, all further steps in the embodiments of the present disclosure may be carried out within the framework of Boolean Satisfiability (SAT) techniques, or formulations. Boolean Satisfiability is the problem of determining if the variables of a given Boolean formula can be assigned in such a way as to make the formula evaluate to "true", which condition is commonly expressed as: SAT. Equally important is to determine whether no such assignments exist, which would imply that the function expressed by the formula is identically "false" for all possible variable assignments. In this latter case, one would say that the function is unsatisfiable, commonly expressed as: UNSAT. In the computational arts there exists a vast body of work in relation to efficient SAT problem solutions. Accordingly, the further steps of the embodiments of the present disclosure, will be formulated and solved as SAT instances. For solution of these SAT problems one may then draw upon the available efficient SAT solvers.

Next one may want to find points in the original circuit, which are typically logic gates, that are the sources of the differences in the outputs of the two circuits. Embodiments of the method solve this task with a point of change finder 130 SAT formulation. It may happen that the source of difference between the first logic of the original circuit and the second logic of the ECO is confined to a single point of change. However, embodiments of the present method can find multiple points of change, which is a more usual and more applicable case than that of a single point of change.

Embodiment of the presented disclosure perform well if the points of change in the original circuit are a relatively few, in the order of 10 or less. As the number of points of change increases, the computational resources needed to apply may become excessive. However, in practice a typical ECO modification usually can be accommodated with less than five points of change, and embodiments of the disclosed method are indeed applicable. Also, for keeping the size of the computations manageable, an assumption is made that the points of change are amongst the logic gates that are neighboring the equivalence line. This assumption in practice is mostly fulfilled.

Finding points of change formulated as a SAT proposition 130, to which one may refer to as a first SAT proposition, may proceed as follows. Conjunctive Normal Form (CNF) Clauses are generated for the logic gates that are neighboring the equivalence line. Calculation of CNF Clauses was already done while performing CEC, accordingly at this point no additional computation resources are used for this calculation. Then, given a test vector T, the primary inputs are made to correspond to values of T. The primary outputs are asserted to the be values of the second logic, name that of the ECO. This proposition will be UNSAT, because no assignment to intermediate variables can make the given input, namely T, produce the given output, namely that of the ECO, because the original circuit does differ from the modified, or ECO, circuit. The question is, eliminating the Clauses of which logic gate may make the formulation satisfiable. If one eliminates from the SAT formulation all the offending Clauses, the process will return SAT, and the gates which generated the eliminated clauses are the sought points of change. Several copies of the circuit which are asserted with several test vectors may generally be needed for accurately identifying the points of change.

Figure 3:
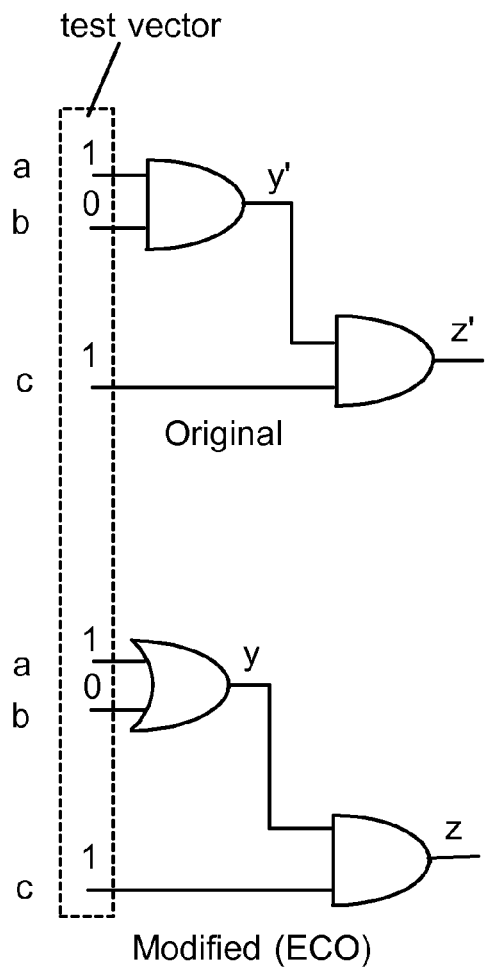
FIG. 3 shows an example in the process of locating points of change in the original circuit.

Embodiments of the method solve the problem of selecting/deselecting various logic gates the following way. For the j-th Clause of the i-th logic gate, one may add a selector Boolean variable $s_j$, such that $C_{ji}(x+y+z \ldots +s_j)$. If $s_j$ is selected to TRUE, the $C_{ji}$ Clause is automatically satisfied, and the other variables, x, y, z, ... can be assigned arbitrarily. A simple illustrative example of this process of locating points of change with selector variables is shown in FIG. 3.

Deselection of Clauses pertaining to different gates may result in SAT, which then points toward functional corrections involving more than one gate.

If with one particular deselection of Clauses the procedure evaluates to SAT, one may test with a different test vector T to assure consistency. To keep the numerical calculation of manageable size, in practice one may want to limit the number of Clauses that the executing program may choose to deselect as this limits the points of change and avoids trivial solutions. One may add "cardinality constraints", to set an absolute upper limit for deselections. Good implementation of such, so called "cardinality constraints", increases the efficiency of finding points of change. Cardinality constraints can be implemented by adding clauses to the SAT formulation which represent an arithmetic adder circuit that simply adds up the sum of values of selector variables and then places a restriction on this sum.

If no deselection choices with the added Boolean variables succeed finding a SAT outcome, it is and indication that the changes represented by the modified circuit are to extensive, and they cannot be found and corrected by embodiments of the present method. In such a case one would quit the execution here.

In FIG. 3, which illustrates the above described first SAT proposition, there is a visibly obvious change between the original and the modified circuit, namely the change of an AND gate to an OR gate. In the figure the shape of the symbols used to indicate the various logic gates are the commonly used ones of the art. After exhausting testing it is clear that the [abc] input with [101] value is a test vector. The CNF Clauses for the two AND gates of the original circuit are: C1: (!a+!b+y'+s1), C2: (a+!y'+s1), C3: (b+!y'+s1), C4: (!y'+!c+z'+s2), C5: (y'+!z'+s2), C6: (c+!z'+s2). An s1 and an s2 deselector Boolean variable have been added the Clauses of each gate. The Clauses for the test vector input, and that of the output, as forced by the ECO, are: C7: (a), C8: (!b), C9: (c), C10: (z'). The SAT proposition can only evaluate to SAT if s1 set to 1, and C1, C2, and C3 are deselected. This deselection indicates that the first AND gate in the original circuit is a point of change.

When one or more points of change are found in the manner described above, one has a location potentially suitable for implementing the desired logic change of the ECO. It has to be verified, however, box marked 140 in the flow chart, if this is indeed the case. If a point of change is verified it means that it is indeed suitable for converting the first logic of the original circuit to the second logic of the modified circuit. The verification process entails testing if an observability condition is fulfilled. If for every test vector, at least one of the logic values in some setting of the logic values of the points of change is capable to propagate to the output, then the observability condition is fulfilled. This means that the points of change are capable of controlling the output for every test vector, and they can be accepted as verified point of change, where appropriately selected logic behavior can influence the output. Checking if the observability condition is fulfilled again is done using Boolean Satisfiability (SAT) techniques, which may be called second SAT techniques.

Figure 4:
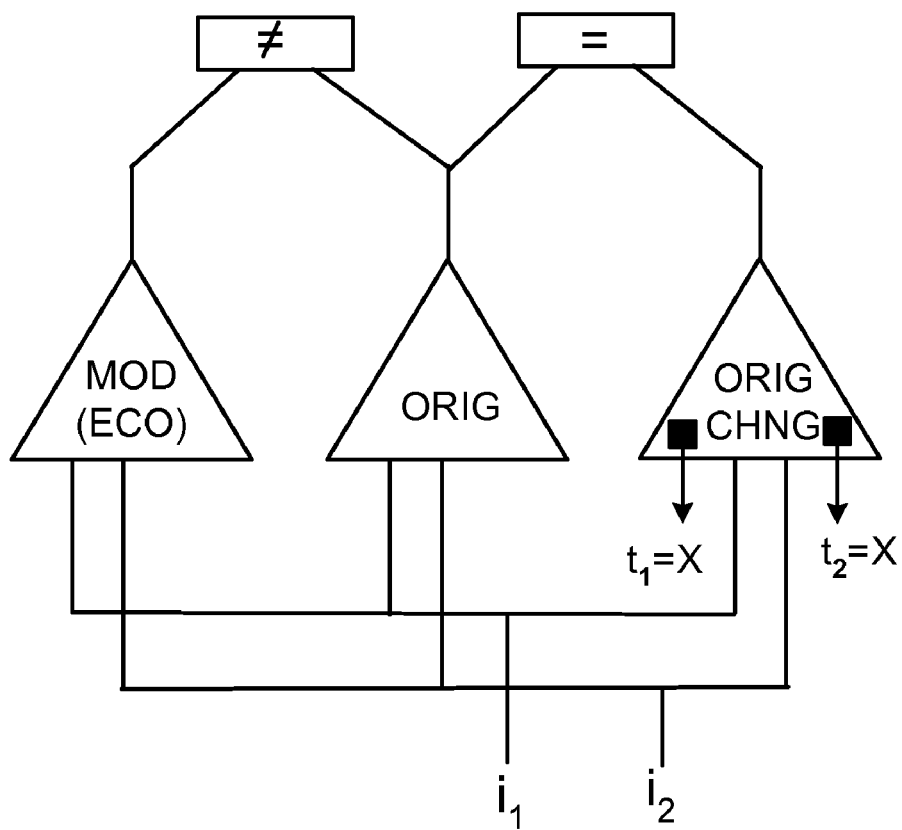
FIG. 4 shows in a symbolic representation the verification of points of change in the original circuit.

FIG. 4 shows in a symbolic representation verification of points of change in the original circuit. The following notations are used. F is the original circuit output, F' is the modified, or ECO circuit output. The inputs $i_1$ and $i_2$ . . . , only two are indicated in FIG. 4, are test vectors. They may be primary inputs, or for more efficient computation may be originated from their image on the equivalence line. Then, one has the original circuit with the already found points of change $t_1$, $t_2$, . . . , which have to be verified. This circuit is noted as "ORIG CHNG" in the figure. The SAT proposition contains two sets of Clauses, A and B. Clauses in A together state that the free variables in the SAT formulation, the variables corresponding to the primary input, should be set such that the output of the original circuit and of the ECO differ, namely they are set to be a test vector. The Clauses in B state that for this same test vector, that regardless of the setting of the t's the ORIG and the ORIG CHNG are the same, which means that the t's do not control the output regardless of their settings. Since one wants A to imply !B, one wants A&B to be UNSAT. In other words, it should be impossible to find a test vector for which the values at the t's do not propagate regardless of their setting, if the t's are indeed viable points of change, hence A&B should be UNSAT. Hence, A: $F(i_1, i_2, \ldots)!=F'(i_1, i_2, \ldots)$, consequently, B: $F(i_1, i_2, \ldots)==F(i_1, i_2, \ldots, t_1=X, t_2=X, \ldots)$. Here the t's are set to a variable value X, and one is checking if there is a test vector for which the X's do not propagate. In the case of multiple outputs, clauses Aj and Bj can be crated for the functions at each output j, denoted Fj and Fj' as:

$Aj:Fj(i_1,i_2,\ldots)!=Fj'(i_1,i_2,\ldots) Bj:Fj(i_1,i_2,\ldots)==Fj(i_1,i_2,\ldots,t_1=X,t_2=X,\ldots)$, and the overall formulation becomes (A1 & B1)||(A2 & B2) . . . (An & Bn) for an n-output function. Again, this formulation has to be UNSAT in order to verify the change points.

It is of note that allowing the logic values on the points of change to be 3-valued, with true, false, and undetermined, together with dual rail encoding, significantly decreases the size of this SAT formulation.

As is noted on the flowchart of FIG. 2, this formulation is SAT, one has to return to the finding the point of change step 130, and if possible to find another set of points of change. If the formulation is UNSAT then the verification 140 is fulfilled one may continue to the steps of finding change functions for the verified points of change, meaning the derivation of a substitute logic to replace of the original logic gates at the verified points of change. This is done in such a manner that overall, the second logic of the modified specification, the ECO, replaces the first logic in the original circuit.

Next task is to find logic functions 140 which are suitable to replace the logic of the original circuit at the points of change. As with previous steps, this task may also be formulated as SAT propositions. Although the points of change have already been located and verified, a feasible input set, or support set in alternate terminology, for the points of change has still to be derived. One may start with a likely input set, by traversing back from the points of change to their closest proven equivalences on the equivalence line, and check if this likely input set is feasible. Being feasible means that if for two input vectors the logic values at the outputs differ, and the points of change are observable for the two input vectors, then at least one member of the input set must also take on differing values for the input test vectors. Such a condition may be cast in a SAT proposition as follows. Select the following Clauses: A: $[F(i_1, t_1=X, t_2=X \ldots)=X][F(i_2, t_1=X, t_2=X \ldots)=X][i_1!=i_2]$ $[F(i_1)!=F(i_2)]$ B:$[(s_1(i_1)=s_1(i_2)) (s_2(i_1)=s_2(i_2)) \ldots]$. Here $s_1$, $s_2$, . . . are members of S the input set, and as before $t_1$, $t_2$, . . . , the points of change, F' the ECO output function, F the original output function, and $i_1$, $i_2$ the two test vectors. Clause A ensures that $i_1$, $i_2$ are input vectors for which an output is different and that at least one of the points of change is observable for both $i_1$ and $i_2$. This is again checked using the dual rail encoding where the points of change are set to the unknown value X, and the outputs are checked for X-propagation. Clause B states that none of the input set members are different. If (A & B) is UNSAT it means that S is a feasible input set. On the other hand, if the proposition (A & B) were SAT, it would mean that the input set is not capable of differentiating between these two test vectors, and one has to continue with the search for a feasible input set. This latter may be done in the following manner, add an additional member, $s_n$, to the input set S, such that $s_n(i_1)!=s_n(i_2)$, and repeat the above discussed SAT formulation to see if the enlarged input set is feasible.

Having the input set S for the points of change, one can now derive the desired logic functions for the replacement. As the verification of the points of change was formulated it guaranteed that there is some valuation on the t-s that control F the output. Having the inputs and the desired output, which is that of the modified circuit, one may then derive a change function for each point of change. For a single output circuit, the change function is implicitly specified as $F'(i, t_1, t_2 \ldots t_n)=F(i)$ The expression for each of the t's can be solved by using standard Boolean equation-solving techniques involving cofactoring the Boolean expression with respect to the desired point of change t, and rewriting the expression as an interval of Boolean functions. In the case of multiple outputs we can have a system of simultaneous Boolean equations which corresponds to the conjunction of the equations: $(F_1'(i, t_1, t_2 \ldots t_n)=F_1(i))$ && $F_2'(i, t_1, t_2 \ldots t_n)=F_2(i)) \ldots )$ The arrived at change functions may now replace 160 the original logic found at the points of change. Additional steps in embodiments of the method may now follow paths known in the art. There are known ways to convert the logic represented in change functions into logic gates forms. These logic gates, arrived at through their change functions, may now be substituted for the logic gates originally found at each point of change. With this final substitution in the original circuit, the second logic of the modified circuit replaced the original first logic.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A method, comprising:
    recognizing two circuits, an original and a modified circuit, wherein said original circuit has a first logic and said modified circuit has a second logic, which said second logic comprises at least one desired logic change relative to said first logic, wherein both said circuits have logic gates, have inputs, and are capable to accept and propagate vectors and to produce outputs;
    detecting an equivalence line in said original circuit by using Combinatorial Equivalence Checking (CEC), wherein said first and second logic are equivalent from said inputs to said equivalence line;
    by using a computer, finding at least one point of change amongst said logic gates that are neighboring said equivalence line by Boolean Satisfiability (SAT) techniques involving Conjunctive Normal Form (CNF) Clauses of said logic gates that are neighboring said equivalence line together with said outputs of said two circuits, and combining said CNF clauses with selector Boolean variables, wherein setting to true any one of said selector Boolean variables allows for individual determination of whether one of said logic gates that are neighboring said equivalence line is amongst said at least one point of change, and limiting how many of said selector Boolean variables are simultaneously set to true, wherein said at least one point of change is potentially suitable for implementing said at least one desired logic change for said first logic, and wherein said at least one point of change has logic values;
    accepting said at least one point of change as at least one verified point of change if an observability condition is fulfilled, wherein said at least one verified point of change is suitable for implementing said at least one desired logic change, and wherein said observability condition is fulfilled if, for every said vector for which said outputs of said original and modified circuits differ, at least one of said logic values of said at least one point of change propagate to said output of said original circuit; and
    deriving a substitute logic for said at least one verified point of change in such manner that said second logic replaces said first logic in said original circuit.

2. The method of claim 1, wherein said method is characterized as being an engineering change order (ECO) implementation.

3. The method of claim 1, said method further comprising:
    deciding whether said observability condition is fulfilled by applying Boolean Satisfiability (SAT) techniques.

4. The method of claim 1, wherein said at least one verified point of change has an input set, said deriving of said substitute logic comprises:
    finding said input set using Boolean Satisfiability (SAT) techniques; and
    deriving a change function for said at least one verified point of change by solving a system of Boolean equations equalizing outputs of said original and modified circuits, wherein in said a system of Boolean equations said change function is implicitly represented.

5. The method of claim 4, said method further comprising:
    converting said change function into a logic gate form, and replacing said at least one verified point of change with said logic gate form.

6. A computer program product comprising a computer readable non-transitory storage medium having a computer readable program code embodied therewith, wherein said computer readable program code when executed on a computer causes said computer to:
    recognize two circuits, an original and a modified circuit, wherein said original circuit has a first logic and said modified circuit has a second logic, which second logic comprises at least one desired logic change relative to said first logic, wherein both said circuits have logic gates, have inputs, and are capable to accept and propagate vectors and to produce outputs;
    detect an equivalence line in said original circuit by using Combinatorial Equivalence Checking (CEC), wherein said first and second logic are equivalent from said inputs to said equivalence line;
    find at least one point of change amongst said logic gates that are neighboring said equivalence line by Boolean Satisfiability (SAT) techniques involving Conjunctive Normal Form (CNF) Clauses of said logic gates that are neighboring said equivalence line together with said outputs of said two circuits, and combining said CNF clauses with selector Boolean variables, wherein setting to true any one of said selector Boolean variables allows for individual determination of whether one of said logic gates that are neighboring said equivalence line is amongst said at least one point of change, and limiting how many of said selector Boolean variables are simultaneously set to true, wherein said at least one point of change is potentially suitable for implementing said at least one desired logic change for said first logic, and wherein said at least one point of change has logic values;

accept said at least one point of change as a least one verified point of change if an observability condition is fulfilled, wherein said at least one verified point of change is suitable for implementing said at least one desired logic change, and wherein said observability condition is fulfilled if, for every said vector for which said outputs of said original and modified circuits differ, at least one of said logic values of said at least one point of change propagate to said output of said original circuit, wherein said observability condition is decided by applying Boolean Satisfiability (SAT) techniques; and derive a substitute logic for said at least one verified point of change in such manner that said second logic replaces said first logic in said original circuit.

* * * * *